United States Patent [19]

Farnsworth et al.

[11] Patent Number: 5,578,870
[45] Date of Patent: Nov. 26, 1996

[54] TOP LOADING TEST SOCKET FOR BALL GRID ARRAYS

[75] Inventors: Jeffery A. Farnsworth, Scottsdale; Patrick H. Harper; Robert Hooley, both of Phoenix, all of Ariz.

[73] Assignee: Precision Connector Designs, Inc., Peabody, Mass.

[21] Appl. No.: 510,763

[22] Filed: Aug. 3, 1995

[51] Int. Cl.$^6$ .............................. H01L 23/34; H01L 23/48
[52] U.S. Cl. ........................... 257/727; 257/48; 257/697; 257/738; 361/759; 361/801; 361/829
[58] Field of Search ...................................... 257/668, 697, 257/726, 727, 738, 48; 361/740, 759, 801, 820, 829

[56] References Cited

U.S. PATENT DOCUMENTS

| | | | |
|---|---|---|---|
| 4,381,131 | 4/1983 | Demnianiuk | 257/727 |
| 4,937,655 | 6/1990 | Miyazaki | 257/668 |
| 5,006,792 | 4/1991 | Malhi et al. | 257/48 |
| 5,045,923 | 9/1991 | Matsuoka | 257/727 |
| 5,302,853 | 4/1994 | Volz et al. | 257/727 |
| 5,349,236 | 9/1994 | Oshino et al. | 257/727 |
| 5,451,816 | 9/1995 | Abe et al. | 257/697 |

*Primary Examiner*—Mahshid Saadat
*Assistant Examiner*—David Osterowski
*Attorney, Agent, or Firm*—Jerry Cohen; Edwin H. Paul; Stephen Y. Chow

[57] ABSTRACT

A ball grid array socket with rows of electrical contacts that extend through holes in a plate. The arrangement of the holes and the electrical contacts provides an entry hole. The contacts are arranged with ends that are cupped to mate with the side and top of the ball contacts of the ball grid array package. The contact surface of the ball grid array package is vertically inserted without any interfering structure. The plate is spring loaded is such a way that the plate is driven parallel to the plane of the ball contacts in a manner that reduces the entry hole opening. This reduced entry opening is arranged and constructed such that with a ball contact insert therein electrical conductivity is provided between the ball contact and the electrical contact, and further where the cupped ends of the electrical contact retain the ball within the hole. The edges of the hole and the top of the cupped electrical contact are chamfered to mate with the curved sides of the ball contact. When force is applied vertically driving the ball contacts into the chamfered edges the hole enlarges allowing the ball to penetrate the hole. As the ball contacts enter deeper into the hole the cupped ends of the electrical contacts ride over the ball such that the ball is retained in a detent fashion. A spring force is provided that is directed to drive the plate and electrical contacts together to reduce the hole. This spring force provides the force necessary to maintain electrical connections between the ball contacts and the electrical contacts of the socket. Pulling the integrated circuit away from the socket over comes the spring force to allow extraction of the integrated circuit. In another embodiment a lever arm is provides that, when activated, drives the plate horizontally compressing the spring and enlarging the entry hole. Releasing the lever arm allows the spring to close and retain the ball grid array integrated circuit. The cupped ends of the electrical contacts are designed to mate with a solid angle at the side/top of the ball contact such that the integrate package is retained within the socket while making electrical connections. The cup is angled to fit on top of the ball and extend between the ball and the IC package such that the ball grid array itself is retained in the socket. In all said arrangements the integrated circuit has unimpeded top entry and exit.

10 Claims, 7 Drawing Sheets

TOP LOADING TEST SOCKET FOR BALL GRID ARRAYS

Priority is claimed under 35 U.S.C. §119 (e) on the Provisional Application No. 60/001014, of common title, of common inventorship and assignment with the present application, filed on Jul. 10, 1995 now abandoned.

FIELD OF THE INVENTION

The present invention relates to sockets for surface mounted, high pin count integrated circuit packages, and more particularly to test and burn in sockets for ball grid array integrated circuit packages.

BACKGROUND OF THE INVENTION

Surface mounted, high pin count integrated circuit packages have been dominated by quad flat packs (QFPS) with various pin configurations, for example, leadless, J-leaded, and gull wing leaded. These packages have closely spaced leads for making electrical connections distributed along the four edges of the flat packages. These packages have become limited by being confined to the edges of the flat pack even though the pin to pin spacing is small. To address this limitation, a new package, a ball grid array (BGA) is not so confined because the electrical contact points are distributed over the entire bottom surfaces of the packages. More contact points can be located with greater spacings than with the QFPS. These contacts are solder balls which facilitate flow soldering of the packages onto a printed circuit board. BGA's are popular alternatives to QFP's.

Sockets that accept BGA's are necessary for testing, burn-in, re-programming, and sometimes for production use where the integrated circuit may need replacing. Several such sockets have been developed by various manufacturers to satisfy this need. Most of these sockets are of a clam shell design, where a hinged top opens to allow package entry, and closing the top retains the package within the socket. The socket includes a bed of contacts spaced to match the BGA contacts and a spring load is arranged to press the package onto the bed of contacts to ensure electrical connections. Some of the prior art BGA sockets align the IC contacts in holes in a printed circuit board. The contacts are arranged to extend through the holes to the other side of the printed circuit board where electrical connections are made. Such an arrangement of enclosing the contacts within the holes has the undesirable feature of retaining heat in the BGA packages during test or burn-in. Other such sockets also enclose the these IC packages so that heat is not easily extracted.

Such prior art sockets may be adequate for small scale handling of BGA but, because of the many separate and complex physical actions needed to insert, test, and extract the BGA package, such clam shell sockets are costly, unwieldy, and unreliable when used for production processing large numbers of BGA packages.

Another limitation of available BGA sockets occurs since the socket contacts place forces onto the IC contacts in the same direction. This force drives one side of the package against an abutment of the socket. With a large number of contacts this cumulative force of many spring loaded contacts is very large and may physically damage the package.

It is an object of the present invention to provide a BGA socket needing few and simple physical operations to insert and extract an IC package. A related object is to provide a BGA socket where the ball contacts themselves enlarge the opening into the BGA socket where the construction of the socket electrical contact and the construction of the through holes retain the ball contact but allow extraction with minimal force.

It is another object of the present invention to provide a socket which balances the forces of the electrical contacts on the BGA contacts and package.

It is yet another object of the present invention to provide a BGA socket with no obstructions that need to be avoided when inserting and extracting the BGA package.

It is another object to provide a BGA socket with superior heat dissipation.

SUMMARY OF THE INVENTION

The foregoing objects are met in a socket for ball grid array contacts including a top structure defining an opening large enough to allow the grid array package to pass through with the ball contacts facing downward, the ball contact surface defining a plane, a plurality of electrical contacts fixed to said socket with a first end arranged to mate with the ball contacts, a plate with through holes, through which said electrical contacts extend, a spring means arranged to provide a force on said plate in a direction parallel with said plane, means for driving said plate to compress said spring means thereby providing a larger opening between the sides of said hole and each of said electrical contacts, said larger opening suitable for accepting the ball contacts, and means for removing the driving force whereby the spring means expands such that said ball contacts are driven into electrical continuity with said electrical contacts.

A socket as defined in claim 1 wherein said means for driving comprises a force directed vertically through said integrated circuit towards said plate wherein the ball contact is driven into said through hole and make a larger opening for entry of the ball contact. The electrical contact includes a cupped end such that a detent action occurs by said cupped end as the ball is driven into the opening.

In a preferred embodiment, the means for driving the plate includes a lever arm and where the lever arm extends in an angled manner above said socket, and where the lever arm extension is arranged on the periphery of the socket such that the lever arm does not interfere with the open top insertion and extraction of the integrated circuit, and where said lever arm has a surface in contact with the plate such that depressing the lever arm enlarges the distance between the ball contacts the edges of the corresponding hole such as to allow insertion of the ball contact into said hole.

The socket has guide surfaces that are arranged and constructed to align the ball contacts of the IC and the electrical contacts of the socket, and the open top allows for cooling air flow.

There is a bottom structure that anchors the electrical contacts and brings out external connections for making electrical connections to the outside world.

Other objects, features and advantages will be apparent from the following detailed description of preferred embodiments thereof taken in conjunction with the accompanying drawings in which:

DETAILED DESCRIPTION OF PREFERRED EMBODIMENTS

Figure 1:
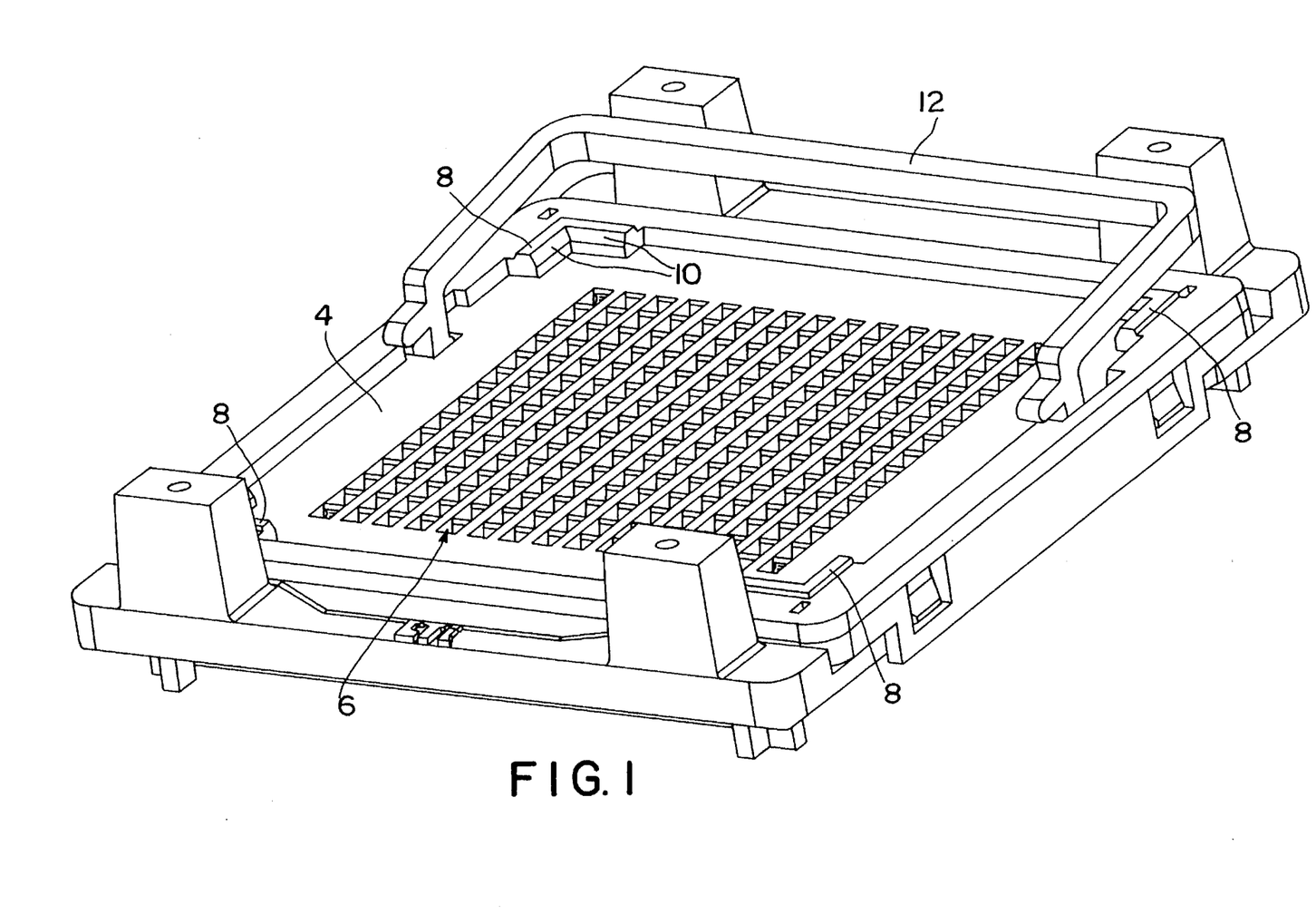
FIG. 1 is a perspective view of a preferred embodiment of the present invention.

FIG. 1 is perspective drawing of a socket 2 made in accordance with the present invention. The socket itself is constructed from dielectric insulating materials, that are well known in the art, and the electrical contacts 26 are made of materials that are also well known in the art. The is a center opening with a plate 4. This plate is populated with through holes 6 where elongated contact pins 8 extend upward through each hole. On the top surface of the plate there are four corners 8 with chamfered surfaces 10 to guide the integrated circuit package (IC). The corners of the ball grid array integrated circuits contact the chamfered edges 10 which guide the IC corners such that the IC ball contacts are each centered on top of a hole 6. In this embodiment a lever arm is shown skirting the periphery of the top of the socket so that the lever arm will not interfere with the entry or extraction of an IC. This lever arm interacts with the plate on two opposing sides.

Figure 2A:
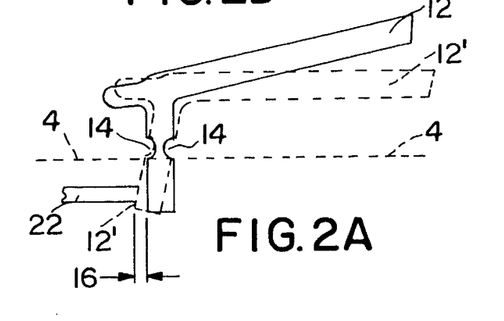
FIG. 2A is a side view of a lever arm arrangement.
Figure 2B:
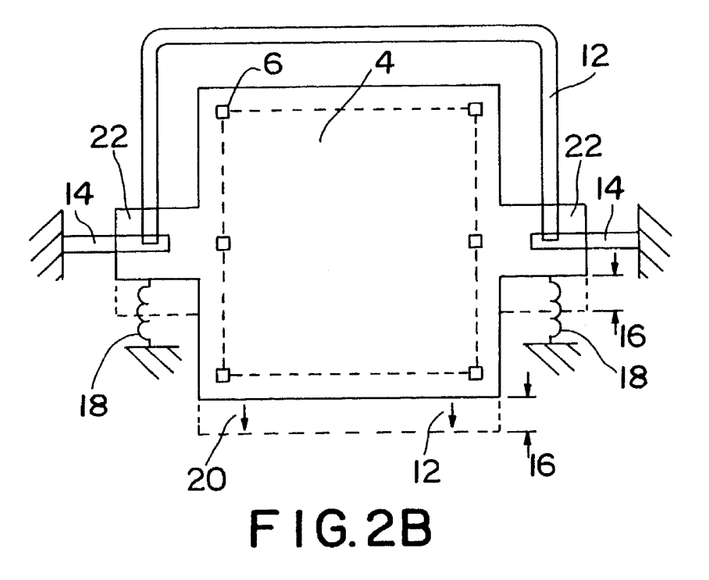
FIG. 2B is a top view of a socket having the lever arm of FIG. 2A.

The operation of the lever arm is shown in FIG. 2A and 2B. FIG. 2A and 2B are simplified operational schematics showing one implementation of such a lever arm. The theory of such operation may be manifest in many practical implementations as are well known in the art. The lever arm 12 extends above the plate 4 around the periphery or outside of the socket, as shown in FIG. 2B. The arm is tied to a fulcrum point 14 that allows the arm to rotate about this fulcrum as shown in activated position 12. The lower end of the arm 12 when activated 12' moves transversely by an amount 16. The direction of the distance 16 is parallel to the surface of the top plate 4. The lower ends of the lever arm are in contact with extensions 22 of the plate 4 and drive the plate by the amount 16. Referring to FIG. 2B, there are two springs 18 arranged at the plate extension 22 to oppose the movement of the plate due to activating the lever arm 12. These springs could be placed in many other positions or be replaced by a single spring or other resilient surface, e.g. rubber. When the lever arm 12 is activated the plate 4 moves in the direction of the arrows 20 by the amount 16 (distances are not to scale). The springs 18 are compressed and the hole openings are enlarged, as described later, to allow the ball contacts to enter. When pressure is released from the lever arm 12 is driven back to the original position by the springs 18. The springs 18 and the fulcrum 14 are shown fixed to a point—the plate moves relative to this fixed point. The plate is retained in the plane by the mechanical design which details are not shown, but whose design is well known within the art.

Figure 2C:
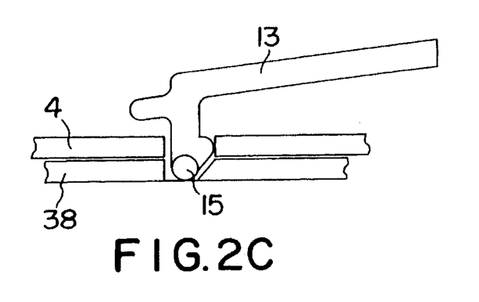
FIG. 2C is a side view of another preferred embodiment lever arm.
Figure 2D:
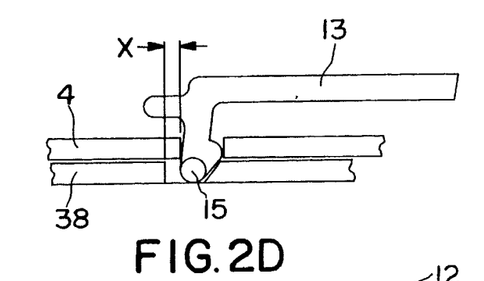
FIG. 2D is a side view of the lever arm activated.
Figure 2E:
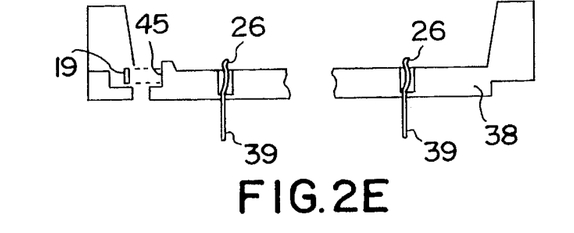
FIG. 2E is a sectioned view of the inner plate of FIG. 1.
Figure 2F:
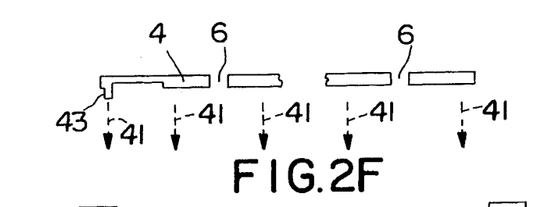
FIG. 2F shows the upper plate of FIG. 1.
Figure 2G:
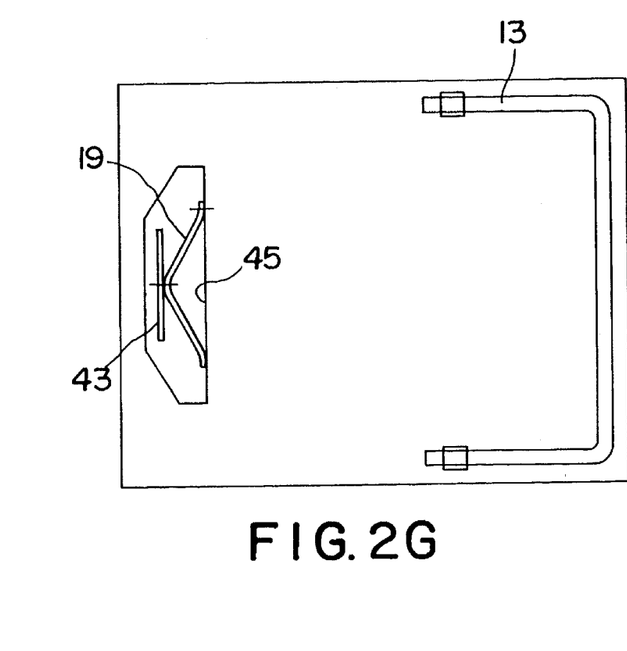
FIG. 2G is a top view of FIG. 2E and 2F.

FIG. 2C shows another preferred embodiment of a lever arm 13. This arm is pivot mounted at 15 which is attached to the inner plate 38. In FIG. 2C, the lever arm 13 is shown unactivated. When the lever arm is depressed as shown in FIG. 2D, plate 4 is moved by an amount shown as "x". As discussed later this opens the aperture between the contact 26 and the edge of the hole 5 enough to allow the ball contact of the chip carrier to enter the hole 6 without any force exerted on the ball or the contact 26. Plate 38 is positioned under the upper plate 4, and the contacts 26 are secured to the plate 38. Extensions 39 extend through and beneath the plate 38 suitable for soldering onto a printed circuit board. Upper plate 4 is shown exploded above plate 38 and the arrows 41 indicate how plate 4 lies on top of plate 38. There are through holed 6 in the upper plate which correspond to the contacts 26 and allow the contacts to extend into the holes 6. Details of the contact, the holes and the ball contacts are shown later. When the top 4 is resting on plate 38, the extension 43 rest adjacent to the bent spring 19. Referring to FIG. 2G the bent spring 19 rest adjacent to the extension 43 and adjacent to the surface 45 of the inner plate 38. When the lever 13 is depressed the top plate 4 drives the extension 43 against the bent spring 19—depressing the bent spring. When the ball contacts have entered the holes 6 and pressure on the lever is removed, the bent spring 19 drives the top surface 4 back to its original position and thereby makes drives the ball into the contact is each hole 6.

Other such arrangements of a spring return are well known in the art, including coiled springs constructed around the lever pivot points.

Figure 2H:
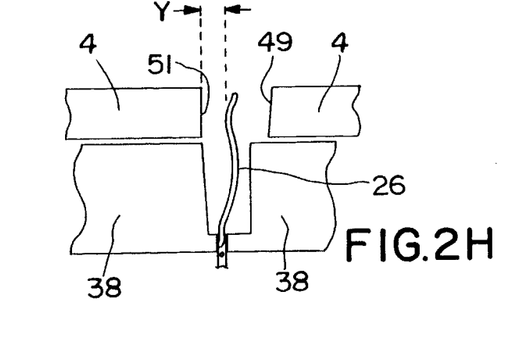
FIG. 2H is a section view of the contact of FIG. 2E.

In another preferred embodiment there is no return spring and the plate 4 is returned to its original position by the combined spring forces of the contacts themselves. FIG. 2H shows such an arrangement. In this preferred embodiment plate 4 is biased by a detent of some other spring force, not shown, but well known in the art at a location separated from the contact 26 by an amount shown as "y". When the lever arm drives the plate 4 in the direction of the arrow 47 by an amount greater than "y", the opening between the contact 26 and the face 49 of the plate 4 opens enough to allow the ball to enter between the contact and the face 49. In this position, the face 51 has made contact and has driven the contact 26 in the direction 47. When the lever is released the contacts 26 drive the face 51 back to the rest position of the contact thus securing and making electrical contact with the ball. The detent or other spring action continues to drive the plate 4 back to the initial position as shown in FIG. 2H. Other such arrangements are well-known in the art.

Figure 3A:
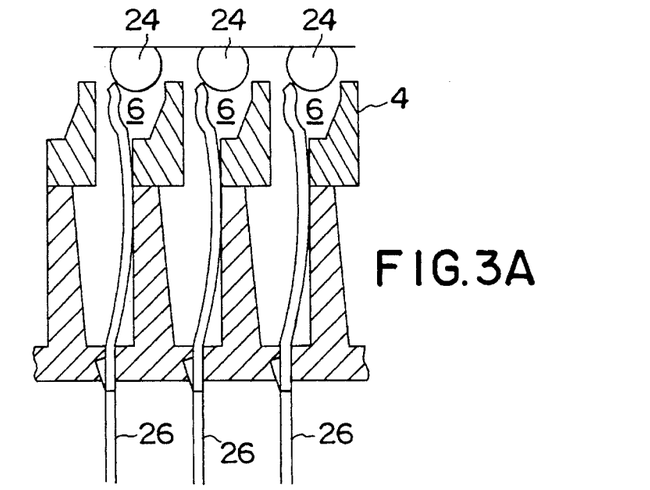
FIG. 3A is a section view of the interaction of the socket contacts and the ball contacts of an integrated circuit.
Figure 3B:
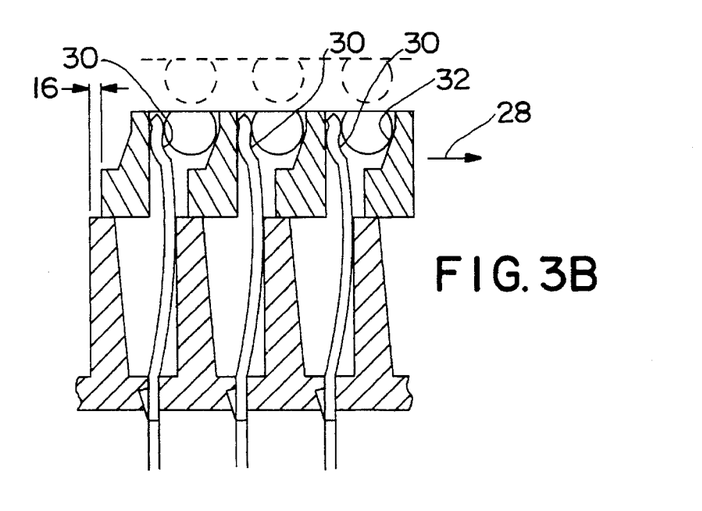
FIG. 3B shows the arrangement of FIG. 3A with the holes opened for ball contact entry.
Figure 3C:
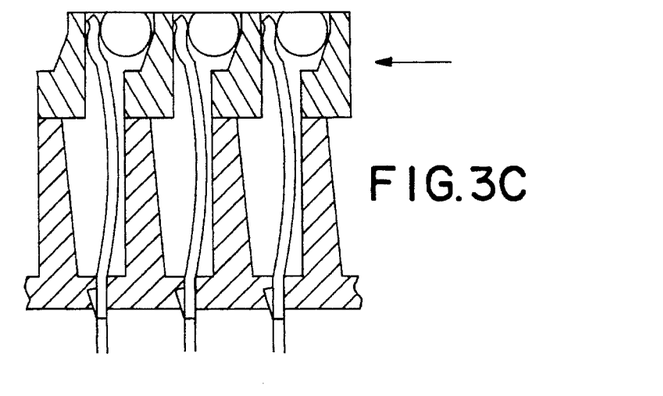
FIG. 3C shows the result of FIGS. 3A and 3B after the ball contact is inserted.

FIG. 3A show a section drawing of three ball contacts 24, adjacent to the openings of three through holes 6 in the plate 4. The electrical contacts 26 f the socket extend through the holes 6 to a point adjacent the ball contacts. The distal ends of the electrical contacts 26 extend through the plate to locations where electrical connections can be made to the test or burn-in equipment (not shown). FIG. 3B shows the plate 4 moved left by the lever arm an amount 16. The opening of the holes are enlarged by the amount 16 such that the ball contacts 24 enter the holes, as shown. FIG. 3C shows the position after the lever arm is released where the springs 18 drive the plate 4 back toward the original position. The ball contacts are encountered by this motion such that the electrical contacts make physical contact with the ball contacts establishing electrical conductivity therebetween. The ball contacts are retained by the upper cupped edge or lip 30 of the electrical contacts 26 and the opposing surface 32 of the hole.

Figure 4A:
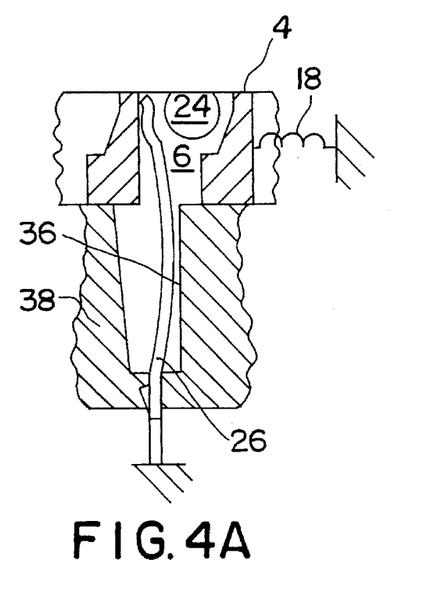
FIGS. 4A, 4B, 4C and 4D show another embodiment of the interaction of the socket and the ball contacts.
Figure 4B:
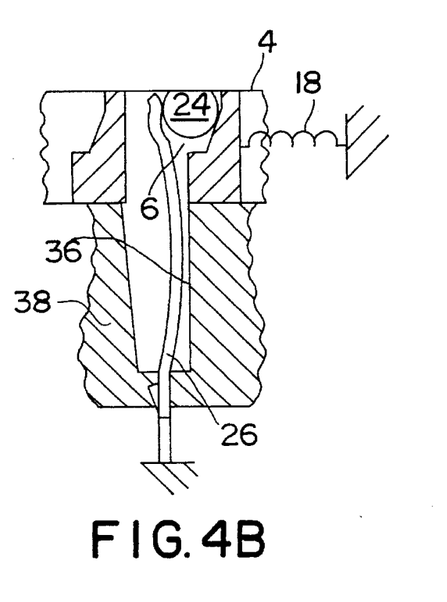

FIG. 4A and 4B show other embodiments where the motion of the plate drives the contacts to enlarge the entry hole for the ball contact. In FIG. 4A, shown with the lever arm 12 activated and the spring 18 compressed, the electrical contact 26 rests against a surface 36 of a housing 38 lying beneath the plate 4. The operation of the spring and the lever arm are representative here as a generic spring force. The contact 26 is fixed at the lower end of the contacts. The opening to the hole 6 is wide enough such that the ball contacts 24 penetrate the hole as shown. When the lever arm is released the spring force drives the plate 4 back to the position shown in FIG. 4B where the ball contact is secured between the electrical contact 26 of the socket and the surface of the hole 6.

Figure 4C:
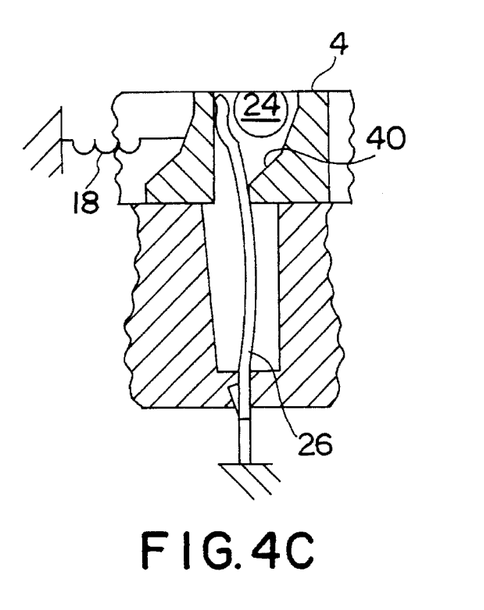
Figure 4D:
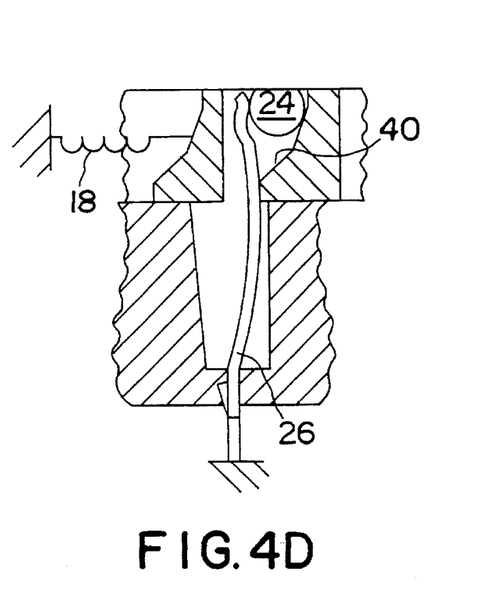

In FIG. 4C and 4D another embodiment is shown where the contact is moved to open the hole for the ball to enter. FIG. 4C shows the lever activated where an extension 40 of the plate within the hole 6 contacts and drives the electrical contact 26 away to make the hole 6 opening larger. The spring 18 is compressed. When the lever is released the spring 18 drives the plate 4 back securing the ball contact and making electrical connections between the socket contact and the ball contact.

Figure 5A:
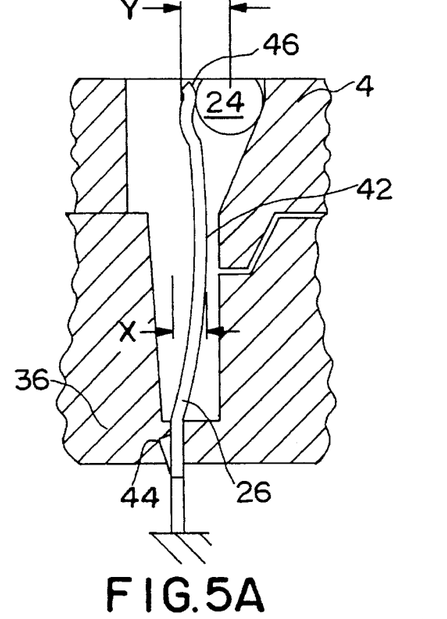
FIG. 5A, 5B, 5C, 5D, and 5E show the detail of another interaction of the socket and the ball contacts.

FIG. 5A is another configuration shown with the ball contact 24 retained within the socket and making electrical connections to the socket electrical contact 26. This embodiment is a different version of the socket of FIG. 4C and 4D. In the socket of FIG. 5A the plate 4 has an extension 4' that penetrates into the bottom plate 36 and is arranged to strike the electrical contact 26 at a location 42 well away from the ball contact. This allows a mechanical advantage where the horizontal motion of the plate 4 of say an amount "x" is amplified at location 42 provides a larger horizontal motion "y" at the cupped end 46 of the contact or made greater when measured at the cupped end of the electrical contact. In this example, if the point x is one third of the distance from where the contact 26 is fixed 44 to the cupped end 46, then the horizontal motion at point 46 is three times the motion at x. In this way a small travel due to the lever arm 12 produces a larger opening travel to accept the ball contact.

Figure 5B:
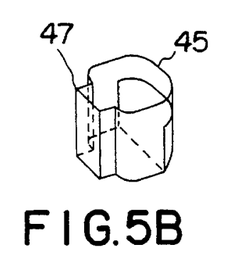
Figure 5C:
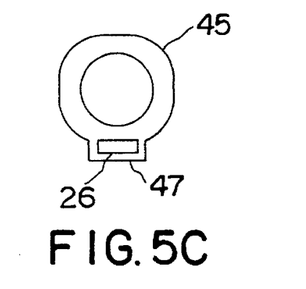
Figure 5D:
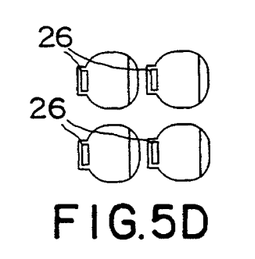
Figure 5E:
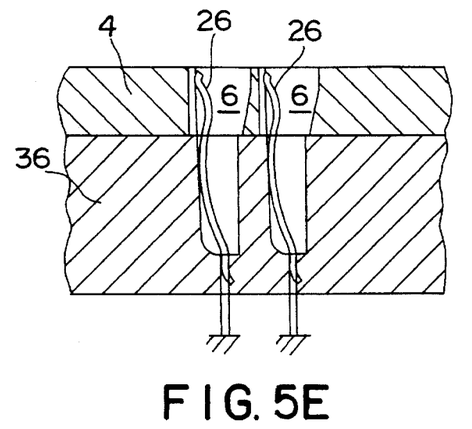

FIG. 5B, 5C, 5D, and 5E show another preferred embodiment with detail of the hole in the top and bottom plates and the orientation of the contact. FIG. 5B shows a perspective view of a keyway hole in the top plate 4. The hole is a rounded square 45 with a vertical channel or keyway 47. FIG. 5C shows the hole from a top view and includes the contact 26. FIG. 5D shows an array of four holes in relation to each other, of course there are many more such hole arranged to match the balls on the IC being used. FIG. 5E shows the relationship of the top plate 4, the bottom plate 36, the contacts 26 and the holes 6. Operation of the lever arm with spring return (not shown) will operate the embodiment of FIG. 5b, C, D, and E as described above for FIG. 4A and 4B. Alternatively, operation of the embodiment of FIG. 5B, C, D, and E could be arranges to operate as described above for FIG. 4C and D, or as FIG. 5A with the appropriate extensions made to the top and bottom plates to allow the extensions of the top plate to operate as described above.

Figure 6:
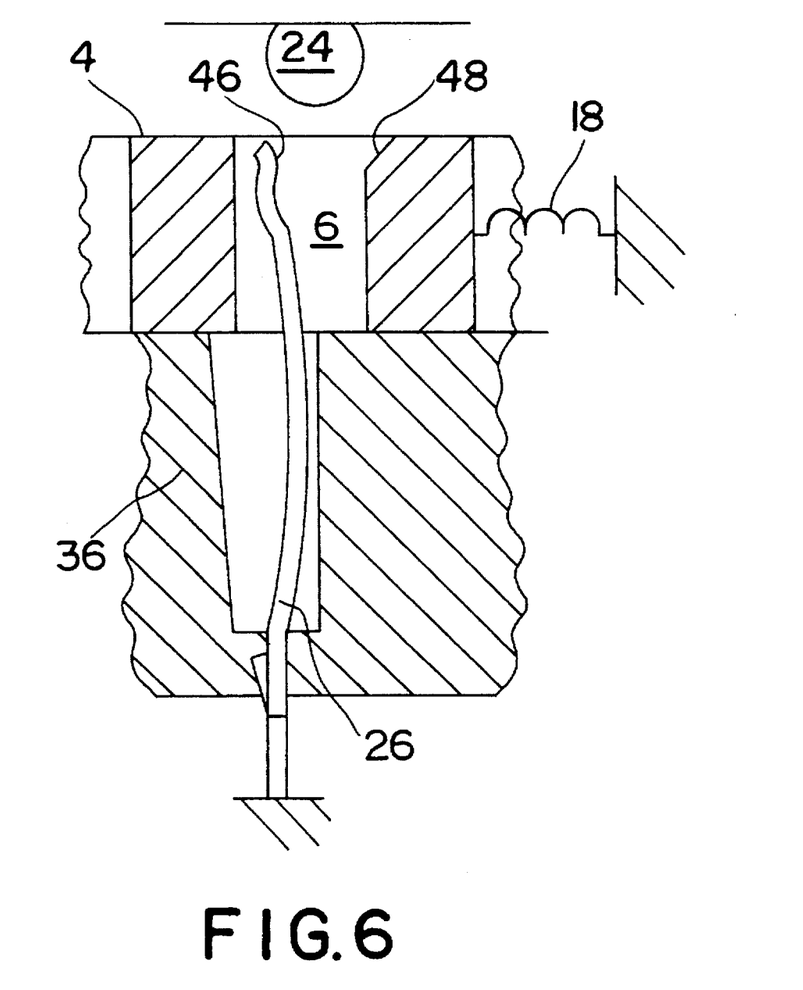
FIG. 6 shows yet another arrangement of a mechanical interaction of the ball contacts and the electrical contacts of the socket.

FIG. 6 shows yet another embodiment of the present invention. The spring 18 maintains the plate 4 as shown, there is a hard stop, not shown, that actually resists further motion by the spring,. Such a design is well known in the art. The plate 4 has a chamfered edge 48 at the edge of the hole 6, and the cupped end of the electrical contact 26 has a matching chamfer 46. The ball contact mates with these two chamfers which, together with the spring force, are designed to yield to the ball as the ball is forced into the chamfers. The ball forces the opening wider such that the ball contact enters the hole 6 and the cupped end of the electrical contact 26 fits over the ball to retain the ball in the socket while making electrical contact. In this embodiment there is no need of a lever arm to actuate the operation. However, a lever arm may be used to release the contact to allow easy withdrawal of the IC from the socket by moving the top plate 4 to compress the spring 18.

It will now be apparent to those skilled in the art that other embodiments, improvements, details and uses can be made consistent with the letter and spirit of the foregoing disclosure and within the scope of this patent, which is limited only by the following claims, construed in accordance with the patent law, including the doctrine of equivalents.

What is claimed is:

1. A socket for ball grid array integrated circuit packages comprising:

a housing with a top structure with an opening large enough to allow the grid array package to pass through with the ball contacts facing said socket, the ball contacts defining a first plane, a top plate with through holes arranged to receive said ball contacts, a plurality of electrical contacts fixed to said socket with a first end arranged to mate with said ball contacts and said first ends extending into said holes in the top plate from a direction opposite the ball contacts, and where the distance between the electrical contact and the edges of the through hole define an opening, spring means arranged to provide a force on the top plate in a direction parallel with said plane, where said spring means acts to reduce said opening, and means for driving the top plate to compress said spring means wherein said opening is enlarged for accepting the ball contacts, wherein, with said ball contacts inserted into said openings, said spring means forces said top plate such that said ball contacts are secured between said edges of said through holes in said top plate and said mating first end of said electrical contacts thereby retaining said ball grid array integrated circuit package in said socket.

2. A socket as defined in claim 1 wherein said means for driving comprises means for driving said ball contacts into said opening to compress said spring means wherein said opening is enlarged by the ball contacts.

3. A socket as defined in claim 2 wherein said tip of the first end of said electrical contacts are chamfered to accept and mate with the ball contact surface, and where the edges of said through hole in said plate are chamfered to accept and mate with the ball contacts surface, said chamfering constructed to allow said ball contacts to drive through and enlarge said opening.

4. A socket as defined in claim 2 wherein the electrical contact comprises a cupped end such that a detent action occurs as the ball is driven through said opening by said cupped end.

5. A socket as defined in claim 1 further comprising guide surfaces arranged to accept the outer edges of the integrated circuit and guide and align the ball contacts with the electrical contacts.

6. A socket as defined in claim 1 wherein the means for driving said plate comprise: a lever arm, where the lever arm extension is arranged on the periphery of the socket such that the lever arm does not interfere with the open top insertion and extraction of the integrated circuit, and where said lever arm has a surface in contact with said top plate such that depressing the lever arm drives the top plate to compress the spring means and enlarge the opening to allow insertion of the ball contact into said hole.

7. A socket for ball grid array integrated circuit packages comprising:

- a housing with a top structure with an opening large enough to allow the grid array package to pass through with the ball contacts facing downward, the ball contacts defining a first plane,
- a plurality of electrical contacts fixed to said socket with a first end arranged to mate with the ball contacts and said first end defining a second plane parallel to said first plane,
- a plate with through holes, through which said electrical contacts extend, and where the distance between the electrical contact and the edges of the through hole define an opening,
- a spring means arranged to provide a force on said plate in a direction parallel with said plane, where said spring means acts to reduce said opening,
- means for enlarging said opening for accepting the ball contacts, and
- wherein said tip of the first end of said electrical contacts are chamfered to accept and mate with the ball contact surface, and wherein the edges of said through hole in said plate are chamfered to accept and mate with the ball contacts surface, said chamfering constructed to allow said ball contacts to drive through and enlarge said opening, and wherein the first end of the electrical contact is cupped such that a detent action occurs by said cupped end as the ball is driven through said opening, and
- guide surfaces arranged to accept the outer edges of the integrated circuit and guide and align the ball contacts with the electrical contacts.

8. A socket for ball grid array integrated circuit packages comprising:

- a housing with a top structure with an opening large enough to allow the grid array package to pass through with the ball contacts facing said socket, the ball contacts defining a first plane,
- a top plate with through holes arranged to receive said ball contacts,
- a plurality of electrical contacts fixed to said socket with a first end arranged to mate with the ball contacts and said first ends extending into said holes in said top plate from a direction opposite the ball contacts, and where the distance between the electrical contacts and the opposing wall of the through hole define an opening for accepting the ball contacts and for making electrical connections between the ball contacts and electrical contacts,
- means for moving the top plate parallel to said first plane so as to change the relative distance between the electrical contact and said opposing wall,
- an abutment constructed on said top plate, said abutment arranged to strike said electrical contacts at a location between said first end and said fixed location when said top plate is moved in a first direction, such that said first end moves a distance greater than the displacement of the contact at the point where said abutment strikes said contact, and wherein said movement of said first end increases the size of said opening sufficient to accept said ball contact, and whereby movement of the top plate in a direction opposite said first direction reduces said opening causing electrical connection between said ball contact and said electrical contact.

9. A socket as defined in claim 8 wherein said first end of said electrical contact further comprises a cupped end that mates with said ball contact so that said ball contact is retained in said opening when said top plate is move to cause said electrical connection between said ball contact and said electrical contact.

10. A socket for ball grid array integrated circuit packages comprising:

- a housing with a top structure with an opening large enough to allow the grid array package to pass through with the ball contacts facing downward, the ball contacts defining a first plane,
- a plurality of electrical contacts fixed to said socket with a first end arranged to mate with the ball contacts and said first end defining a second plane parallel to said first plane,
- a plate with through holes, through which said electrical contacts extend, and where the distance between the electrical contact and the edges of the through hole define an opening,
- a spring means arranged to provide a force on said plate in a direction parallel with said planes, where said spring means acts to reduce said opening,
- a lever arm, where the lever arm extension is arranged on the periphery of the socket such that the lever arm does not interfere with the open top insertion and extraction of the integrated circuit,
- a fulcrum constructed and arranged engaging said lever arm, said lever arm having a surface in contact with said plate, such that depressing the lever arm drives the said surface and said plate to compress the spring means and enlarge the opening to allow insertion of the ball contact into said hole, and wherein the first end of the electrical contact is cupped such that a detent action occurs by said cupped end as the ball is driven through said opening, and
- guide surfaces arranged to accept the outer edges of the integrated circuit and guide and align the ball contacts with the electrical contacts.

* * * * *